(12) United States Patent
Ledbetter

(10) Patent No.: US 9,335,378 B2
(45) Date of Patent: May 10, 2016

(54) FLEXIBLE MAGNETIC FIELD COIL FOR MEASURING IONIC QUANTITY

(76) Inventor: Finley Lee Ledbetter, Denton, TX (US)

( * ) Notice: Subject to any disclaimer, the term of this patent is extended or adjusted under 35 U.S.C. 154(b) by 211 days.

(21) Appl. No.: 13/455,657

(22) Filed: Apr. 25, 2012

(65) Prior Publication Data

US 2013/0147590 A1    Jun. 13, 2013

Related U.S. Application Data

(60) Provisional application No. 61/570,247, filed on Dec. 13, 2011, provisional application No. 61/570,253, filed on Dec. 13, 2011, provisional application No. 61/570,258, filed on Dec. 13, 2011.

(51) Int. Cl.
| | |
|---|---|
| *H01F 27/29* | (2006.01) |
| *G01R 31/327* | (2006.01) |
| *H01F 27/28* | (2006.01) |
| *H01H 1/00* | (2006.01) |

(Continued)

(52) U.S. Cl.
CPC .......... *G01R 31/327* (2013.01); *G01R 31/3274* (2013.01); *G01R 31/3275* (2013.01); *H01F 27/28* (2013.01); *H01H 1/0015* (2013.01); *H01H 33/66* (2013.01); *H01H 75/04* (2013.01)

(58) Field of Classification Search
CPC .. H01F 27/28; G01R 31/327; G01R 31/3271; G01R 31/3272; G01R 31/3274; G01R 31/3275; H01H 75/04; H01H 1/0015; H01H 33/66
USPC .................. 324/262, 405, 407–412, 415, 424, 324/459–460, 463; 218/118–142
See application file for complete search history.

(56) References Cited

U.S. PATENT DOCUMENTS

| | | | | |
|---|---|---|---|---|
| 3,378,761 | A | * | 4/1968 | Morgan ........................ 324/260 |
| 4,163,130 | A | * | 7/1979 | Kubota ................ H01H 33/668 218/122 |

(Continued)

FOREIGN PATENT DOCUMENTS

| | | |
|---|---|---|
| EP | 0079181 B1 | 3/1986 |
| JP | 04132131 A * | 5/1992 |

(Continued)

OTHER PUBLICATIONS

Predicting the Remaining Life of Vacuum Interrupters in the Feild; NETA World Journal; 2012; pp. 1-5.

(Continued)

*Primary Examiner* — Tung X Nguyen
*Assistant Examiner* — David Frederiksen
(74) *Attorney, Agent, or Firm* — Gardere Wynne Sewell LLP

(57) ABSTRACT

A flexible magnetic coil for determining ion migration rates inside a vacuum device can include a plurality of insulated copper wires held together as a bundle. A positive pole can be connected to a first end of the bundle for receiving a positive DC voltage. A negative pole can be connected to a second end of the bundle for completing a circuit with the positive pole. A DC voltage ranging from ten volts to four thousand volts from a power supply can be connected to the positive pole, the negative pole, or combinations thereof. The bundle can be a loop and can form a circuit when the DC voltage is applied to the loop. The bundle can create a flexible electromagnetic field of at least one Gauss around the vacuum device using a calculation of a number of turns of insulated copper wire multiplied by applied DC current.

17 Claims, 6 Drawing Sheets

(51) Int. Cl.
*H01H 33/66* (2006.01)
*H01H 75/04* (2006.01)

(56) References Cited

U.S. PATENT DOCUMENTS

| | | | | |
|---|---|---|---|---|
| 4,440,995 A | * | 4/1984 | Lange | H01H 33/668 218/122 |
| 4,484,818 A | | 11/1984 | Houston | |
| 5,453,587 A | | 9/1995 | Hurley et al. | |
| 5,710,536 A | * | 1/1998 | Fastman | 336/200 |
| 8,824,116 B2 | | 9/2014 | Smith et al. | |
| 2012/0063631 A1 | * | 3/2012 | Choi et al. | 381/396 |

FOREIGN PATENT DOCUMENTS

| | | |
|---|---|---|
| JP | 04132131 A | 5/1992 |
| JP | 08180776 A | 7/1996 |
| JP | 08180776 A * | 7/1996 |
| JP | 2010197132 A | 9/2010 |
| WO | WO 2010131794 A1 * | 11/2010 |

OTHER PUBLICATIONS

Zhai Ziyu, Jiang Ziuchen, and Jin Zhijian; Study on Internal Pressure Measurement of Vacuum Interrupter; IEEE 19th International Symposium on Discharges and Electrical Insulation in Vacuum; 2000; pp. 775-778.

International Search Report mailed Mar. 8, 2013 in PCT/US2012/069211.

Written Opinion mailed Mar. 8, 2013 in PCT/US2012/069211.

International Preliminary Report on Patentability for Co-Pending PCT Application No. PCT/US2012/069211 issued Jun. 17, 2014, 6 pgs.

\* cited by examiner

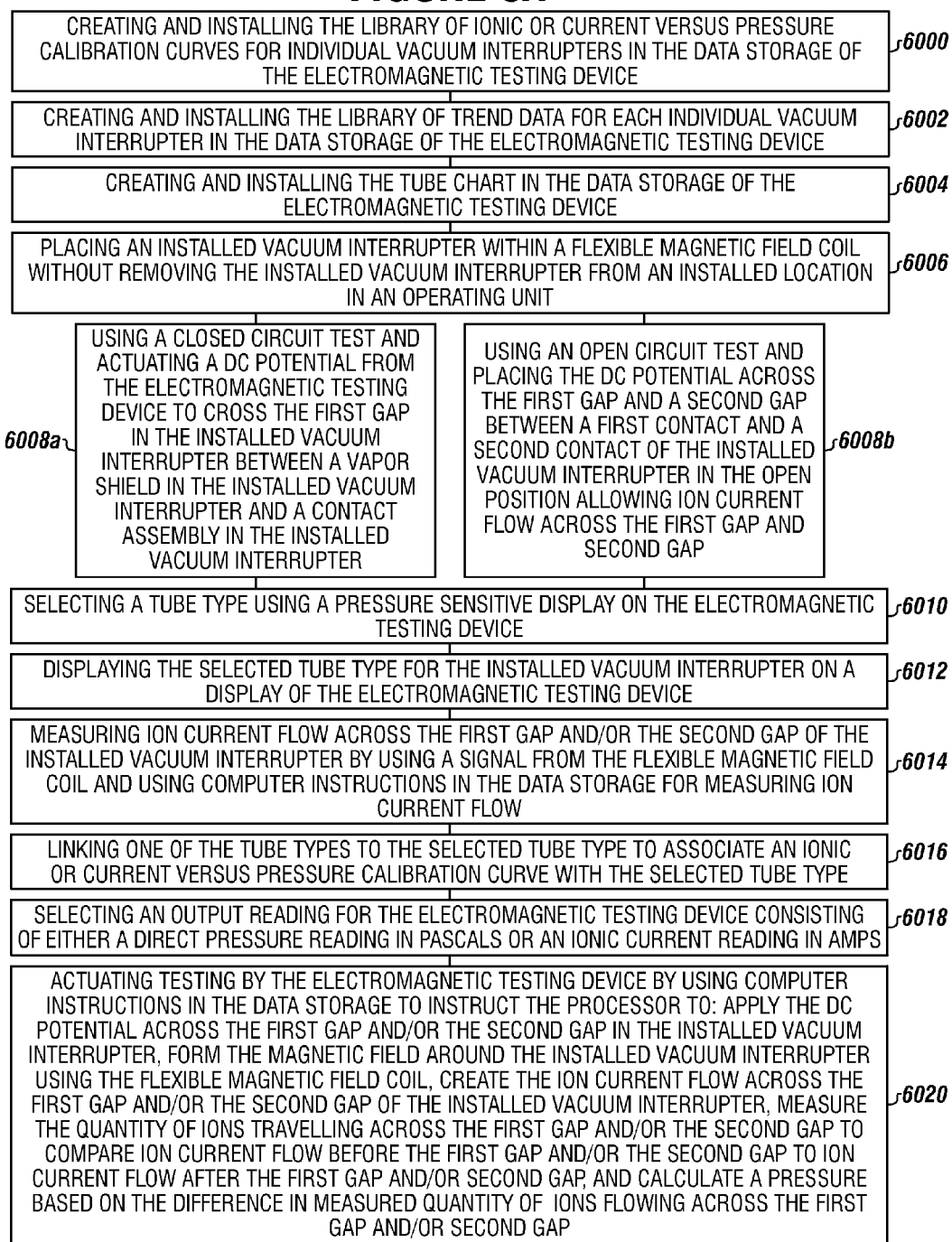

(5A)

| | |
|---|---|
| USING A CLOSED CIRCUIT TEST AND ACTUATING A DC POTENTIAL FROM THE ELECTROMAGNETIC TESTING DEVICE TO CROSS THE THIRD GAP IN THE INSTALLED VACUUM INTERRUPTER BETWEEN THE VAPOR SHIELD IN THE INSTALLED VACUUM INTERRUPTER AND THE CONTACT ASSEMBLY IN THE INSTALLED VACUUM INTERRUPTER | 6022 |
| MEASURING ION CURRENT FLOW ACROSS THE THIRD GAP OF THE INSTALLED VACUUM INTERRUPTER BY USING A SIGNAL FROM THE FLEXIBLE MAGNETIC FIELD COIL AND USING COMPUTER INSTRUCTIONS IN THE DATA STORAGE FOR MEASURING ION CURRENT FLOW | 6024 |
| ACTUATING TESTING BY THE ELECTROMAGNETIC TESTING DEVICE BY USING COMPUTER INSTRUCTIONS IN THE DATA STORAGE TO INSTRUCT THE PROCESSOR TO: APPLY THE DC POTENTIAL ACROSS THE THIRD GAP IN THE INSTALLED VACUUM INTERRUPTER, FORM THE MAGNETIC FIELD AROUND THE INSTALLED VACUUM INTERRUPTER USING THE FLEXIBLE MAGNETIC FIELD COIL, CREATE THE ION CURRENT FLOW ACROSS THE FIRST GAP AND/OR THE SECOND GAP OF THE INSTALLED VACUUM INTERRUPTER, MEASURE THE QUANTITY OF IONS TRAVELLING ACROSS THE THIRD GAP TO COMPARE ION CURRENT FLOW BEFORE THE THIRD GAP TO ION CURRENT FLOW AFTER THE THIRD GAP, AND CALCULATE A PRESSURE BASED ON THE DIFFERENCE IN MEASURED QUANTITY OF IONS FLOWING ACROSS THE THIRD GAP | 6026 |
| DETERMINING AN ANTICIPATED LIFE EXPECTANCY OF THE INSTALLED VACUUM INTERRUPTER BY: POSITIONING THE CALCULATED AMP OR CALCULATED PRESSURE ON THE IONIC OR CURRENT VERSUS PRESSURE CALIBRATION CURVE FOR THE INSTALLED VACUUM INTERRUPTER AND IDENTIFYING THE TREND DATA FROM THE LIBRARY OF TREND DATA CORRESPONDING TO THE INSTALLED VACUUM INTERRUPTER AND TO THE CALCULATED PRESSURE OR TO THE CALCULATED AMP OF THE INSTALLED VACUUM INTERRUPTER TO DETERMINE THE ANTICIPATED LIFE EXPECTANCY IN YEARS AND MONTHS FOR THE INSTALLED VACUUM INTERRUPTER | 6028 |
| PROVIDING THE CALCULATED AMP OR CALCULATED PRESSURE TO AN RS232 INTERFACE OR A PRINTER | 6030 |
| USING A PRINTER THAT IS INTEGRATED WITH THE ELECTROMAGNETIC TESTING DEVICE TO PRINT THE CALCULATED AMP OR CALCULATED PRESSURE AND TO PROVIDE A LOCATION OF THE CALCULATED AMP OR CALCULATED PRESSURE ON THE IONIC OR CURRENT VERSUS PRESSURE CALIBRATION CURVE OF THE INSTALLED VACUUM INTERRUPTER | 6032 |
| RESETTING THE DISPLAY USING A RESET BUTTON ON THE ELECTROMAGNETIC TESTING DEVICE TO: TURN OFF AN LED LIGHT, CLEAR THE CALCULATED AMP, CLEAR THE CALCULATED PRESSURE, OR COMBINATIONS THEREOF | 6034 |
| USING THE LED LIGHT TO INDICATE WHEN THE ELECTROMAGNETIC TESTING DEVICE IS PERFORMING THE TEST | 6036 |
| CONNECTING THE PROCESSOR WITH A NETWORK FOR COMMUNICATION TO A CLIENT DEVICE REMOTE TO THE PROCESSOR | 6038 |

*FIGURE 5B*

FLEXIBLE MAGNETIC FIELD COIL FOR MEASURING IONIC QUANTITY

CROSS REFERENCE TO RELATED APPLICATIONS

The present application claims priority to and the benefit of U.S. Provisional Patent Application Ser. No.: 61/570,247 filed on Dec. 13, 2011, entitled "METHOD TO PREDICT A USABLE LIFE OF A VACUUM INTERRUPTER IN THE FIELD;" U.S. Provisional Patent Application Ser. No.: 61/570,253 filed on Dec. 13, 2011, entitled "ELECTROMAGNETIC TEST DEVICE TO PREDICT A USABLE LIFE OF A VACUUM INTERRUPTER IN THE FIELD;" and U.S. Provisional Patent Application Ser. No.: 61/570,258 filed on Dec. 13, 2011, entitled "FLEXIBLE MAGNETIC FIELD COIL FOR MEASURING IONIC QUANTITY." These references are hereby incorporated in their entirety.

FIELD

The present embodiments generally relate to a flexible magnetic field coil usable to apply a magnetic field to force movement of ions or current across one or more gaps inside vacuum interrupters for detecting ionic quantity after a high voltage potential is applied to the vacuum interrupters.

BACKGROUND

A need exists for a flexible magnetic field coil that can easily and removably create a magnetic field in the field around large vacuum devices such as vacuum interrupters.

A need exists for an easy to install and flexible magnetic field coil that can create magnetic fields and can be configured to create a larger diameter magnetic fields, smaller diameter magnetic fields with the same number of loops, weaker magnetic fields with fewer loops, or stronger magnetic fields with more loops or turns; all with the same device and without requiring any additional parts or attachments.

A need exists for a flexible magnetic field coil that can help provide a signal to an electromagnetic testing device concerning ion quantity passing through a vacuum device that has had a large charge of high voltage DC potential applied thereto.

A need exists for a flexible magnetic field coil that can help America's economy by creating service jobs for testing that never existed before using a highly versatile device that can be used by an untrained, unskilled worker in the field.

A need exists for a flexible magnetic field coil that can avoid the introduction of X-rays into work environments; thereby providing safe and healthy work environments.

The present embodiments meet these needs.

BRIEF DESCRIPTION OF THE DRAWINGS

The detailed description will be better understood in conjunction with the accompanying drawings as follows:

FIGS. 5A and 5B depict an embodiment of a method for predicting a usable life of vacuum interrupters.

Figure 1:
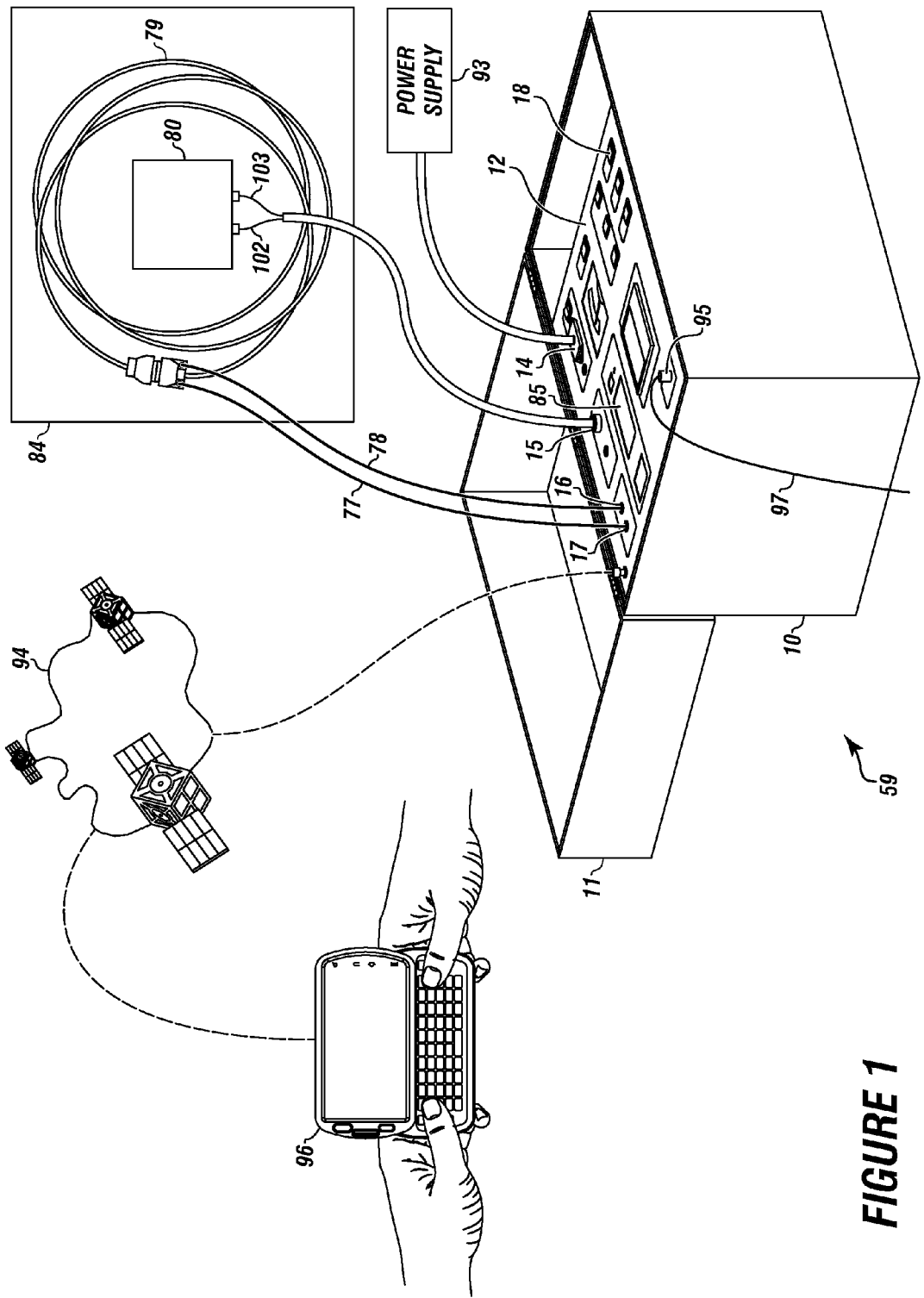
FIG. 1 depicts an electromagnetic testing device connected to a flexible magnetic field coil, power supply, and an installed vacuum interrupter using a positive engagement wire and a negative engagement wire according to one or more embodiments.

The present embodiments are detailed below with reference to the listed Figures.

DETAILED DESCRIPTION OF THE EMBODIMENTS

Before explaining the present apparatus in detail, it is to be understood that the apparatus is not limited to the particular embodiments and that it can be practiced or carried out in various ways.

Historically, air magnetic and oil interrupters were the only types of interrupters used on circuit breakers rated at 2.4 kilovolts (kV) or higher, with air magnetic interrupters being used on lower voltages in this rating, including voltages ranging from 2.4 kV to 25 kV, and with oil interrupters being most commonly used on voltages higher than 25 kV, primarily because of their ability to interrupt higher arc energies.

Air magnetic interrupters degrade somewhat each time they are opened under load, and degrade significantly when they are interrupted under fault. Contacts can be repaired or replaced if required; however, maintenance of such circuit breakers is not always properly scheduled, which can result in failures.

In addition to maintenance issues, arc-chutes are large and heavy, and some arc chutes are fragile and can be broken if not properly handled.

Oil interrupters are heavy and submerged in oil, such that reaching the oil interrupters for inspection is difficult. As such, oil interrupters are not always maintained as they should be.

The present embodiments relate to a flexible magnetic field coil for vacuum interrupters that provides for ease of testing and maintenance of the vacuum interrupters, use of flexible and lightweight testing equipment, and allowance for testing in the field, each of which is not available with prior flexible magnetic field coils for vacuum interrupters.

The flexible magnetic field coil can create a magnetic field and produce a signal related to ion quantity that passes across one or more gaps in a vacuum device that has received a high voltage potential charge.

In embodiments, the flexible magnetic field coil can be used on vacuum interrupters that are compact and sealed.

The flexible magnetic field coil can be used on vacuum interrupters that have short gap travel distances, such as gap travel distances ranging from about 8 mm to about 12 mm.

The flexible magnetic field coil can cause less damage than other methods for testing vacuum interrupters.

A primary basis for the wide acceptance of vacuum interrupters is financial. A life span and the number of vacuum interrupters can be increased using the flexible magnetic field coil disclosed herein. The flexible magnetic field coil can allow the life span for vacuum interrupters to range from about five times to about ten times longer, particularly for SF-6 vacuum interrupters.

The flexible magnetic field coil can include simple yet ruggedly constructed equipment to test the vacuum interrupters.

The flexible magnetic field coil can connect to an electromagnetic testing device.

The flexible magnetic field coil can be a loop made from a plurality of insulated copper wires, such as 40 insulated copper wires. The insulation on the copper wires can be a rubberized plastic or other insulating material.

The flexible magnetic field coil can create a large diameter magnetic field, such as a four-foot diameter magnetic field, or a small size diameter magnetic field, such as a six-inch diameter magnetic field. The flexible magnetic field coil can be versatile for switching between different sizes of magnetic fields without requiring extra parts.

The flexible magnetic field coil can be versatile enough to handle different sizes of vacuum devices for detection, and can additionally and simultaneously create stronger or weaker magnetic fields. The field strength can be changed based on the number of multiple turns around the vacuum device made by the flexible magnetic field coil.

For example, the flexible magnetic field coil can make a weak field around the vacuum device by having only a few turns around the vacuum device installed in the field, such as two turns. A stronger field can be made by making more turns around the vacuum device, such as from 4 to 10 turns.

The flexible magnetic field coil can be extremely versatile and can be used for creating a magnetic field around a six-inch diameter vacuum device for a first test. Then, the same loop of the flexible magnetic field coil can be used to create a different strength field around a twelve-inch diameter vacuum device without adding parts or requiring a user to have special training.

A simple chart comparing magnetic field strength to diameter and turns around the vacuum device to be tested can be used to operate the flexible magnetic field coil.

The flexible magnetic field coil can be a loop that is from about two feet to about 20 feet long. In embodiments, the loop can be 60 feet long and still operate from a 110 power supply, such as an electrical utility grid connected to rectifiers that modify the current to DC.

The flexible magnetic field coil can be made from a plurality of copper wires that can be insulated.

A positive pole and a negative pole can be connected to the flexible magnetic field coil at one point on the loop, such that the flexible magnetic field coil can receive a DC current and form a magnetic field.

In embodiments, the flexible magnetic field coil can connect directly to a DC power supply to regulate current that creates the magnetic field.

In embodiments, the flexible magnetic field coil can be additionally connected to a processor with a data storage and computer instructions in the data storage to monitor the magnetic field strength and signals.

Until recently, lubrication and preventative maintenance were the only means of preserving circuit breaker life. The accepted field service test for vacuum interrupters was a simple go/no-go AC potential test. Vacuum interrupters can catastrophically fail at any time, taking many days to clear, repair and get switchgear back online.

Testing with the flexible magnetic field coil connected to the electromagnetic testing device with various computer instructions can prevent unnecessary damage to circuit breakers by predicting the usable life of the vacuum interrupters.

The flexible magnetic field coil can allow testing to be performed in the field, and not just in an assembly plant; thereby allowing a trend towards failure to be accurately predicted.

The flexible magnetic field coil can be used for testing vacuum interrupters in the field that have three gaps. The flexible magnetic field coil can allow for testing of the gaps between internal contacts of the vacuum interrupter and a metal vapor shield of the vacuum interrupter.

The three gaps in the vacuum interrupters can include a first gap between a moving contact portion of a contact assembly and a fixed contact portion of the contact assembly, a second gap between the moving contact portion and the metal vapor shield of the vacuum interrupter, and a third gap between the fixed contact portion and the metal vapor shield.

The flexible magnetic field coil can allow for simultaneous testing of all three gaps for leak detection. The flexible magnetic field coil can prevent explosions of the vacuum interrupters by enabling quick and cheap field detection of leaks using flexible, lightweight testing equipment.

The flexible magnetic field coil can be used on vacuum interrupters that have metal vapor shields that capture metal vapor or other contaminant particles created by metallic arcing that occurs when contacts open. The metal vapor shield can capture or inhibit the metal vapor or contaminant particles from entering the gap between the moving contact portion and the fixed contact portion.

The metal vapor or contaminant particles can be highly ionized, can cause thermal expansion, and can be drawn to the metal vapor shield by electrostatic forces. When the metal vapor or contaminant particles contact the metal vapor shield, the metal vapor or contaminant particles can quickly solidify and adhere to the metal vapor shield, which can help maintain both the vacuum level inside the vacuum interrupter and efficient working of the vacuum interrupter.

The metal vapor shield can also keep an electrostatic field uniformly distributed, both inside and outside of the vacuum interrupter, to ensure a longer life for the vacuum interrupter.

The metal vapor shield can protect a ceramic body of the vacuum interrupter from high levels of radiation during arcing and interruption, and prevent high level arcs from directly contacting the ceramic body.

Accordingly, measuring the gap between the metal vapor shield and the moving contact and the gap between the metal vapor shield and the fixed contact can ensure proper functioning of the vacuum interrupter. Additionally, the flexible magnetic field coil can be used to measure the gap between the fixed contact portion and moving contact portion, also referred to as the primary gap.

The flexible magnetic field coil can provide improved results when high-potential testing is performed on the vacuum interrupter. The flexible magnetic field coil can allow a high-potential voltage to be applied across open contacts of the vacuum interrupter, allow the voltage to increase to a test value, and then measure leakage of current.

The flexible magnetic field coil can allow for determination of very low quantities of current leakage for both AC high-potential tests and DC high-potential tests.

The high-potential tests can use the Penning Discharge Principle. The flexible magnetic field coil can utilize the Penning Discharge Principle that when a high voltage is applied to open contacts in a gas and a contact structure is surrounded with a magnetic field, an amount of current flow between plates is a function of gas pressure, applied voltage and magnetic field.

The flexible magnetic field coil can be used in creating a magnetic field using a field coil. The vacuum interrupter can be placed into the field coil.

The magnetic field can be created using the flexible magnetic field coil, and then applying direct current (DC) to the flexible magnetic field coil. Next, a constant DC voltage, such as 10 kV, can be applied to open contacts, and current flow through the vacuum interrupter can be measured with the field coil. In one or more embodiments, the DC voltage can range from ten volts to four thousand volts.

Since the magnetic field (D) and the applied voltage (DC) are both known, the only variable remaining is the pressure of the gas. If the relationship between the gas pressure and the current flow is known, then the internal pressure can be calculated based on the amount of current flow. The flexible magnetic field coil can utilize this calculation.

One or more embodiments of the flexible magnetic field coil do not generate X-rays during testing, in addition to providing accurate test values in the field using DC high-potential tests. In other flexible magnetic field coils, DC voltages, when applied across the gaps of the contacts, generate X-rays that are known to be harmful to operators without protection.

As such, the flexible magnetic field coil allows vacuum interrupters to be tested in the field without the need for lead-based suits by reducing the potential of harm to operators. By not generating X-rays during testing, the flexible magnetic field coil can save lives and prevent known harms to humans.

The flexible magnetic field coil can be used to provide high-potential tests and contact-resistant tests to vacuum interrupters in the field to determine if the vacuum interrupters need to be replaced. The high-potential tests and contact-resistant tests can be quickly performed in the field using the flexible magnetic field coil, such as in less than three hours.

The flexible magnetic field coil can allow for testing of pressure inside the vacuum interrupters. Magnetrons and associated equipment have traditionally been used to test for pressure inside vacuum interrupters. Magnetrons and associated equipment are too bulky and heavy for efficient use in the field, are difficult to calibrate when moved, do not have trending and prediction tools for evaluating their tests, and require the removal of the vacuum interrupters from associated circuit breaker mechanisms.

The flexible magnetic field coil can be easily used by less experienced operators in the field without requiring removal of the vacuum interrupters from associated circuit breakers.

The flexible magnetic field coil can allow for testing, prediction, and trending of vacuum interrupter failure rates in the field.

One or more embodiments of the flexible magnetic field coil can be applied directly to the vacuum interrupter. The flexible magnetic field coil can be used on an entire pole, such as when the vacuum interrupter is not readily available.

Turning now to the figures, FIG. 1 depicts an embodiment of the electromagnetic testing device 59 having a connected body 10 and a closeable lid 11.

The electromagnetic testing device 59 can have a face plate 12. Capacitors beneath the face plate 12 can collect and release an electric charge. Also, rectifiers, relays, and a circuit board with the processor and the data storage can be disposed beneath the face plate 12.

The face plate 12 can have a power-in plug 14 for receiving 110 volts or 220 volts of AC current or another current from a power supply 93.

The capacitors beneath the face plate 12 can connect to additional plugs in the face plate 12, such as a high voltage output plug 15, a magnetic control positive output plug 16, and a magnetic control negative output plug 17.

The electromagnetic testing device 59 can connect to a flexible magnetic field coil 79 through a positive magnetic control wire 78 engaging the magnetic control positive output plug 16 and a negative magnetic control wire 77 engaging the magnetic control negative output plug 17.

In operation, upon actuation of the electromagnetic testing device 59, the electromagnetic testing device 59 can provide a current to the flexible magnetic field coil 79; thereby creating a magnetic field around an installed vacuum interrupter 80.

The installed vacuum interrupter 80 can be installed at an installed location 84, such as a power plant's circuit breaker switch room.

The installed vacuum interrupter 80 can be connected to the electromagnetic testing device 59 through a positive engagement wire 102 and a ground engagement wire 103.

The flexible magnetic field coil 79 can be wrapped around the installed vacuum interrupter 80.

The electromagnetic testing device 59 can have a ground plug 95 connecting to a ground wire 97 for grounding the electromagnetic testing device 59.

A test button 18 can be installed on the face plate 12 to actuate computer instructions in the data storage to actuate a test.

A display 85 on the face plate 12 can display calculated test results to a user.

The electromagnetic testing device 59 can be in communication with a client device 96 through network 94 for remote monitoring and actuation of the electromagnetic testing device 59.

In operation, when a strong magnetic field is applied around the vacuum interrupter 80, ions will move producing a current across an open contact. This ionization current is directly proportional to a pressure inside the vacuum interrupter 80. With a known ionic or current versus pressure curve, the pressure inside the vacuum interrupter 80 can be easily determined through the Penning Discharge Principle.

Figure 2:
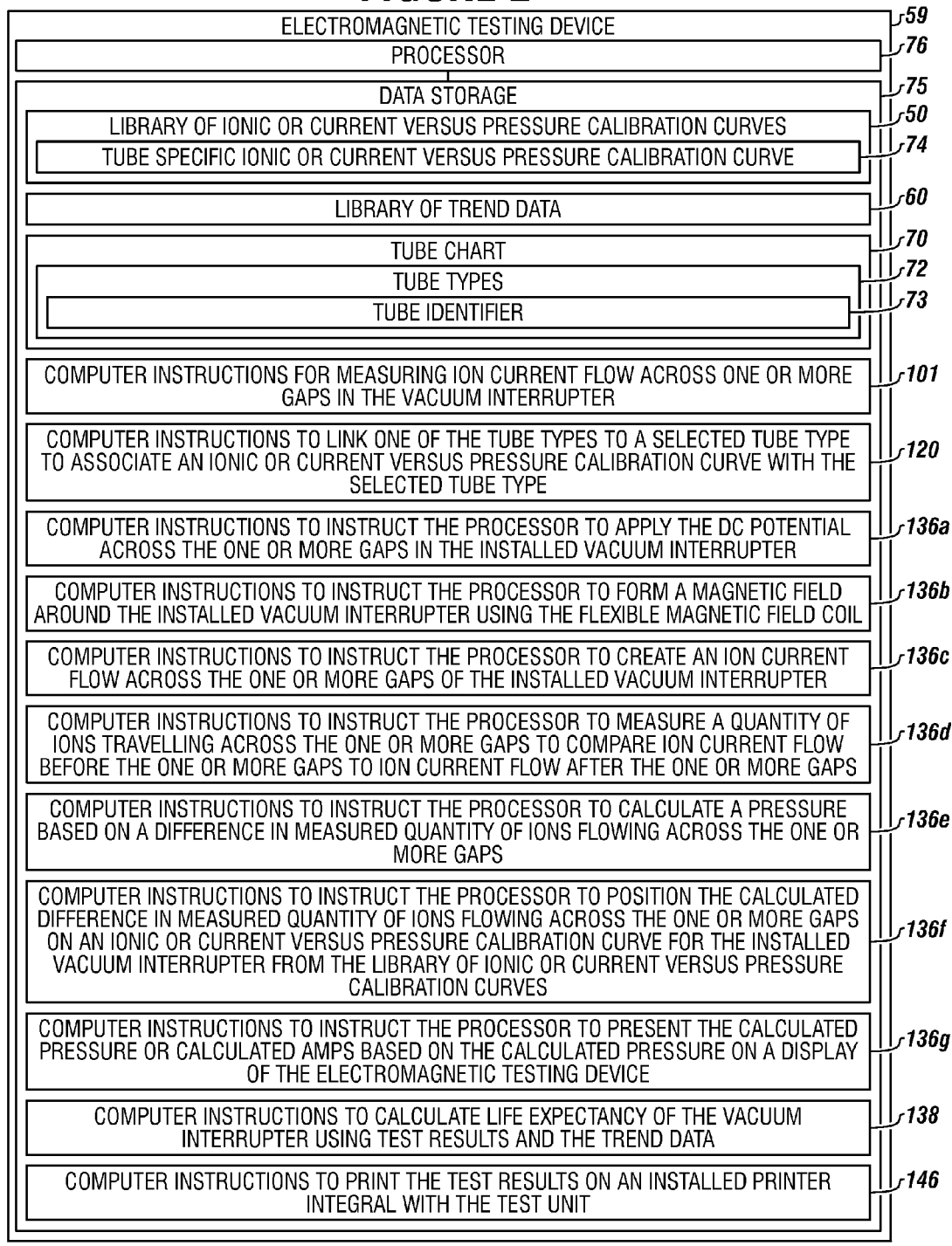
FIG. 2 depicts a data storage of the electromagnetic testing device in communication with a processor according to one or more embodiments.

FIG. 2 depicts the data storage 75 of the electromagnetic testing device 59 in communication with the processor 76.

A library of ionic or current versus pressure calibration curves 50 can be stored in the data storage 75.

A library of trend data 60 for each individual vacuum interrupter can be stored in the data storage 75.

The library of trend data 60 can include at least a vacuum interrupter serial number, a vacuum interrupter model or type, calculated pressure from other tests by the electromagnetic testing device testing identical model vacuum interrupters, calculated amp from other tests by the electromagnetic testing device testing identical model vacuum interrupters or combinations thereof. Additional trend data can be stored in the library of trend data.

A tube chart 70 of tube types 72 can be stored in the data storage 75. Each tube type can have a tube identifier 73. Each tube identifier 73 can be linked to a tube specific ionic or current versus pressure calibration curve 74 in the library of ionic or current versus pressure calibration curves 50.

The data storage 75 can include computer instructions for measuring ion current flow across one or more gaps in the vacuum interrupter 101.

The data storage 75 can include computer instructions to link one of the tube types to a selected tube type to associate an ionic or current versus pressure calibration curve with the selected tube type 120.

The data storage 75 can include computer instructions to instruct the processor to apply the DC potential across the one or more gaps in the installed vacuum interrupter 136a.

The data storage 75 can include computer instructions to instruct the processor to form a magnetic field around the installed vacuum interrupter using the flexible magnetic field coil 136b.

The data storage 75 can include computer instructions to instruct the processor to create an ion current flow across the one or more gaps of the installed vacuum interrupter 136c.

The data storage 75 can include computer instructions to instruct the processor to measure a quantity of ions travelling across the one or more gaps to compare ion current flow before the one or more gaps to ion current flow after the one or more gaps 136*d*.

The data storage 75 can include computer instructions to instruct the processor to calculate a pressure based on a difference in measured quantity of ions flowing across the one or more gaps 136*e*.

The data storage 75 can include computer instructions to instruct the processor to position the calculated difference in measured quantity of ions flowing across the one or more gaps on an ionic or current versus pressure calibration curve for the installed vacuum interrupter from the library of ionic or current versus pressure calibration curves 136*f*.

The data storage 75 can include computer instructions to instruct the processor to present the calculated pressure or calculated amps based on the calculated pressure on a display of the electromagnetic testing device 136*g*.

The data storage 75 can include computer instructions to calculate life expectancy of the vacuum interrupter using test results and the trend data 138.

The data storage 75 can include computer instructions to print the test results on an installed printer integrated with the test unit 146.

Figure 3:
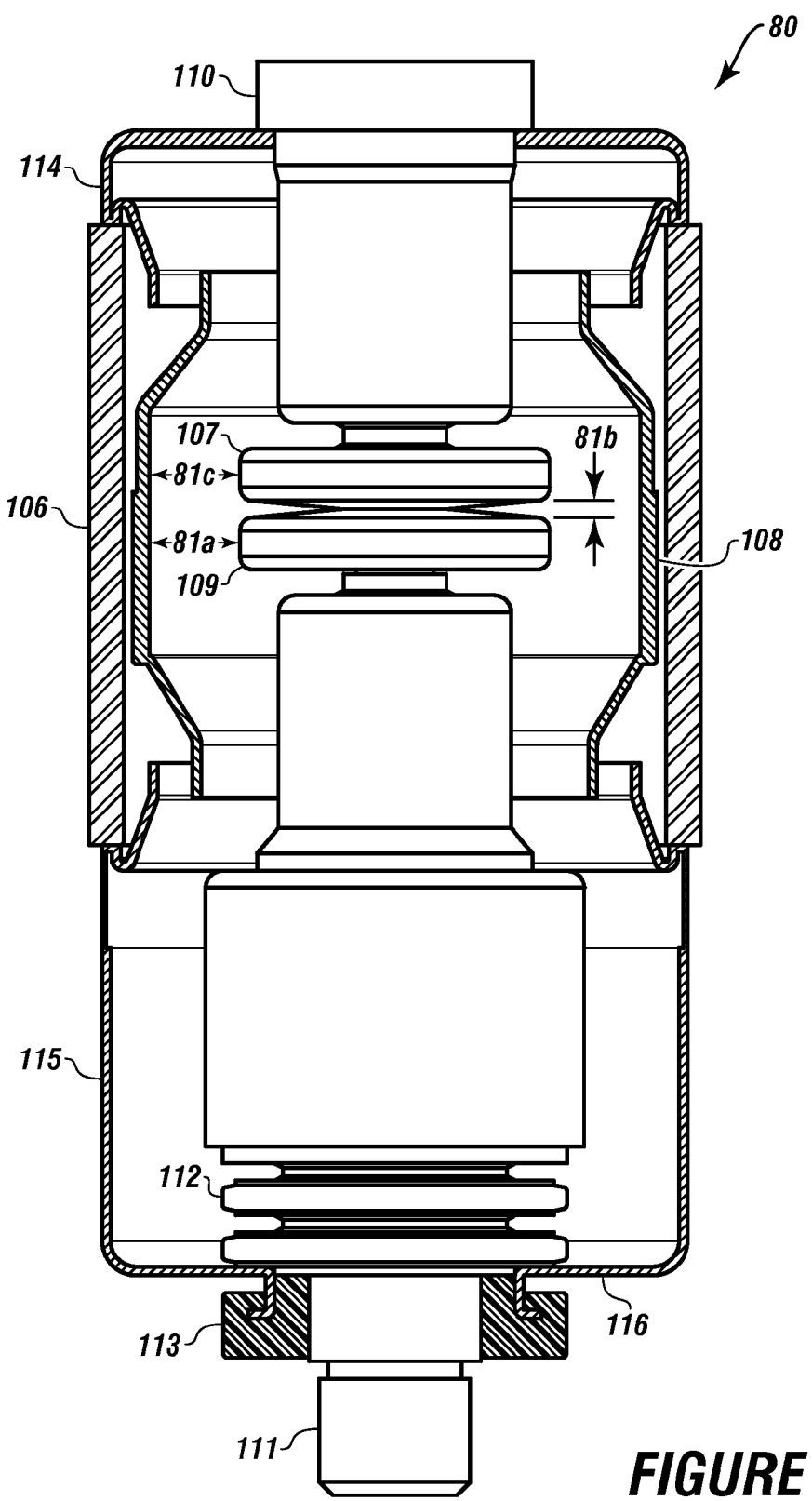
FIG. 3 depicts a vacuum interrupter according to one or more embodiments.

FIG. 3 depicts an embodiment of a vacuum interrupter 80 with a body 106, also referred to as an insulator body. The body 106 can be made of glass, metal, ceramic, or combinations of these materials, forming a case.

The body 106 can have one or two segments.

The vacuum interrupter 80 can have a top 114, bottom 115, and mounting means 116.

The vacuum interrupter 80 can have a fixed contact 107, which can be metal, slotted, solid, or combinations thereof. The fixed contact 107 can engage a fixed contact stem 110.

One or more embodiments of the vacuum interrupter 80 can have a vapor shield 108, which can be for shielding metal vapor or other contaminant. The vapor shield 108 can collect metal that comes off of contacts during application of current to the contact, can stop sputtering material from contaminating the inside of the case that occurs, and can control flashing.

The vacuum interrupter 80 can have a moving contact 109 connected to a moving contact stem 111 surrounded by a moving contact guide 113, which can be made of plastic.

A bellows 112, which can be made of stainless steel, can be disposed within the bottom 115 between the moving contact 109 and moving contact stem 111.

In operation, the moving contact stem 111 can engage a circuit breaker motor, which is not shown.

A first gap 81*a* can be formed between the moving contact 109 and the vapor shield 108, a second gap 81*b* can be formed between the fixed contact 107 and the moving contact 109, and a third gap 81*c* can be formed between the fixed contact 107 and the vapor shield 108.

Figure 4:
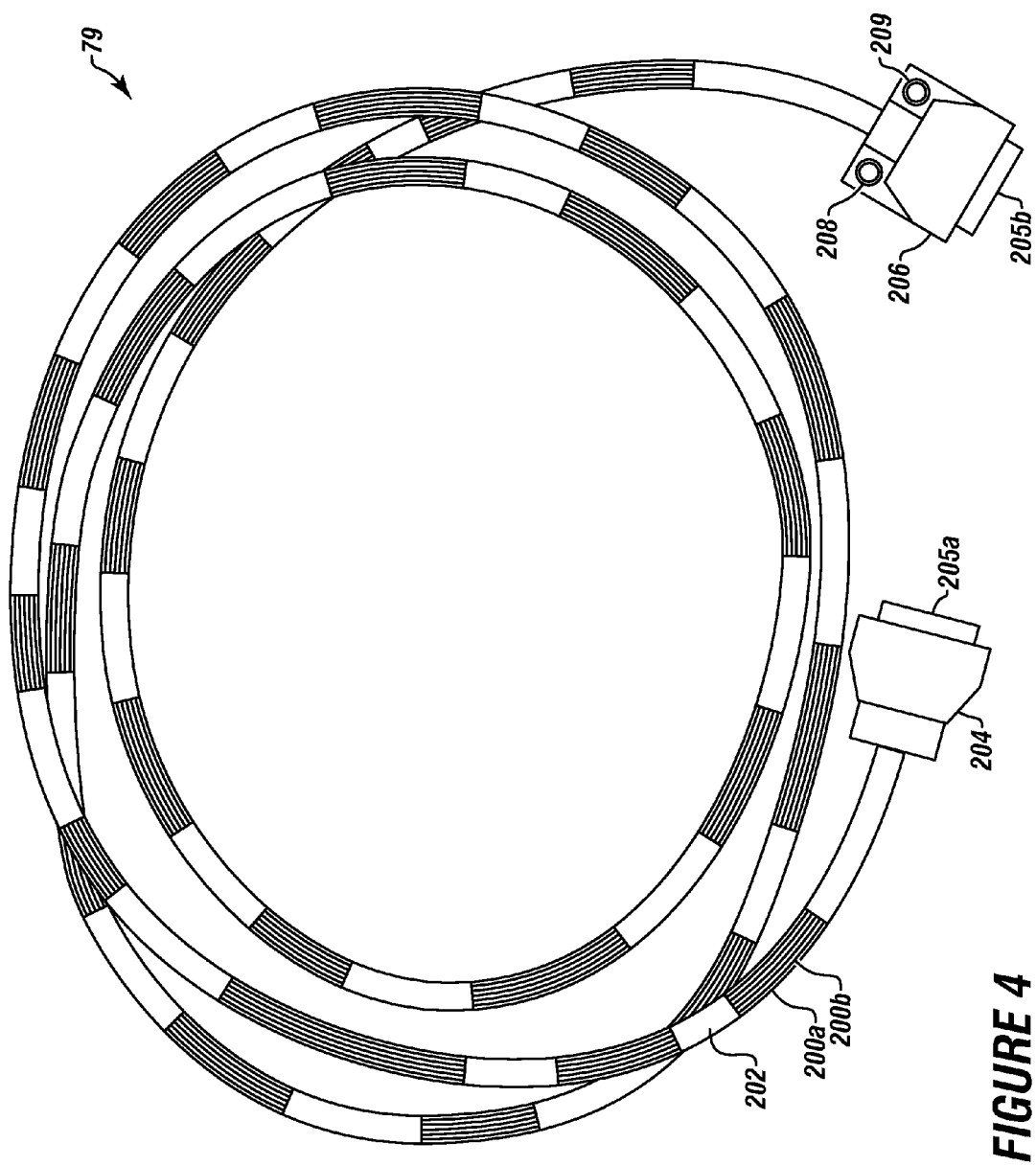
FIG. 4 depicts the electromagnetic testing device according to one or more embodiments.

FIG. 4 depicts a detail of the flexible magnetic field coil 79.

The flexible magnetic field coil 79 can have a plurality of copper wires 200*a* and 200*b*, each having an insulated covering, and each being grouped together to form a bundle.

The bundle can have a diameter ranging from about 0.10 inches to about 2 inches. The bundle can be held together with electrical tape or tubing 202 or another type of fastener that does not affect magnetic fields.

A first coupling 204 can individually engage each wire of the plurality of copper wires 200*a* and 200*b* at one end. A second coupling 206 can individually engage each wire of the plurality of copper wires 200*a* and 200*b* at another end. The first coupling 204 can have a first fitting 205*a* to engage a second fitting 205*b* of the second coupling 206 to create a loop.

The second coupling 206 can have has a positive pole 208 and a negative pole 209 for receiving DC current that assists the plurality of copper wires 200*a* and 200*b* in forming the magnetic field.

One or more embodiments can include a plurality of copper wires 200*a* and 200*b* that connect together directly without the first coupling 204 and second coupling 206; thereby forming a loop with the positive and negative poles.

In embodiments, the flexible magnetic field coil 79 can be manufactured as a loop that can have a diameter of 15 feet or more. The loop can be looped over the installed vacuum device with multiple turns to have an ionic flow monitored and affected by the magnetic field.

A formula can be used to determine how many turns the flexible magnetic field coil must be turned to create an effective magnetic field. For example, the number of turns can be multiplied by the current, which equals the magnetic field.

FIGS. 5A and 5B depict an embodiment of the method.

The method can include creating and installing the library of ionic or current versus pressure calibration curves for individual vacuum interrupters in the data storage of the electromagnetic testing device, as illustrated by box 6000.

The method can include creating and installing the library of trend data for each individual vacuum interrupter in the data storage of the electromagnetic testing device, as illustrated by box 6002.

The method can include creating and installing the tube chart in the data storage of the electromagnetic testing device, as illustrated by box 6004.

The method can include placing an installed vacuum interrupter within a flexible magnetic field coil without removing the installed vacuum interrupter from an installed location in an operating unit, as illustrated by box 6006.

The method can include using a closed circuit test and actuating a DC potential from the electromagnetic testing device to cross the first gap in the installed vacuum interrupter between a vapor shield in the installed vacuum interrupter and a contact assembly in the installed vacuum interrupter, as illustrated by box 6008*a*; or the method can include using an open circuit test and placing the DC potential across the first gap and a second gap between a first contact and a second contact of the installed vacuum interrupter in the open position allowing ion current flow across the first gap and second gap, as illustrated by box 6008*b*.

The method can include selecting a tube type using a pressure sensitive display on the electromagnetic testing device, as illustrated by box 6010.

The method can include displaying the selected tube type for the installed vacuum interrupter on a display of the electromagnetic testing device, as illustrated by box 6012.

The method can include measuring ion current flow across the first gap and/or the second gap of the installed vacuum interrupter by using a signal from the flexible magnetic field coil and using computer instructions in the data storage for measuring ion current flow, as illustrated by box 6014.

The method can include linking one of the tube types to the selected tube type to associate an ionic or current versus pressure calibration curve with the selected tube type, as illustrated by box 6016.

The method can include selecting an output reading for the electromagnetic testing device consisting of either a direct pressure reading in Pascals or an ionic current reading in amperes, as illustrated by box 6018.

The method can include actuating testing by the electromagnetic testing device by using computer instructions in the data storage to instruct the processor to: apply the DC potential across the first gap and/or the second gap in the installed vacuum interrupter, form the magnetic field around the installed vacuum interrupter using the flexible magnetic field coil, create the ion current flow across the first gap and/or the second gap of the installed vacuum interrupter, measure the quantity of ions travelling across the first gap and/or the second gap to compare ion current flow before the first gap and/or the second gap to ion current flow after the first gap and/or second gap, and calculate a pressure based on the difference in measured quantity of ions flowing across the first gap and/or second gap, as illustrated by box 6020.

The method can include using a closed-circuit test and actuating a DC potential from the electromagnetic testing device to cross the third gap in the installed vacuum interrupter between the vapor shield in the installed vacuum interrupter and the contact assembly in the installed vacuum interrupter, as illustrated by box 6022

The method can include measuring ion current flow across the third gap of the installed vacuum interrupter by using a signal from the flexible magnetic field coil and using computer instructions in the data storage for measuring ion current flow, as illustrated by box 6024.

The method can include actuating testing by the electromagnetic testing device by using computer instructions in the data storage to instruct the processor to: apply the DC potential across the third gap in the installed vacuum interrupter, form the magnetic field around the installed vacuum interrupter using the flexible magnetic field coil, create the ion current flow across the first gap and/or the second gap of the installed vacuum interrupter, measure the quantity of ions travelling across the third gap to compare ion current flow before the third gap to ion current flow after the third gap, and calculate a pressure based on the difference in measured quantity of ions flowing across the third gap, as illustrated by box 6026.

The method can include determining an anticipated life expectancy of the installed vacuum interrupter by: positioning the calculated amp or calculated pressure on the ionic or current versus pressure calibration curve for the installed vacuum interrupter and identifying the trend data from the library of trend data corresponding to the installed vacuum interrupter and to the calculated pressure or to the calculated amp of the installed vacuum interrupter to determine the anticipated life expectancy in years and months for the installed vacuum interrupter, as illustrated by box 6028.

The method can include providing the calculated amp or calculated pressure to an RS232 interface or a printer, as illustrated by box 6030.

The method can include using a printer that is integrated with the electromagnetic testing device to print the calculated amp or calculated pressure and to provide a location of the calculated amp or calculated pressure on the ionic or current versus pressure calibration curve of the installed vacuum interrupter, as illustrated by box 6032.

The method can include resetting the display using a reset button on the electromagnetic testing device to: turn off an LED light, clear the calculated amp, clear the calculated pressure, or combinations thereof, as illustrated by box 6034.

The method can include using the LED light to indicate when the electromagnetic testing device is performing the test, as illustrated by box 6036.

The method can include connecting the processor with a network for communication to a client device remote to the processor, as illustrated by box 6038.

While these embodiments have been described with emphasis on the embodiments, it should be understood that within the scope of the appended claims, the embodiments might be practiced other than as specifically described herein.

What is claimed is:

1. A flexible magnetic coil system for applying a magnetic field to cause ion current flow across one or more gaps inside a vacuum interrupter, the flexible magnetic coil system comprising:
    a plurality of wires held together as a bundle and configured to be looped around the vacuum interrupter;
    a positive pole connected to the bundle;
    a negative pole connected to the bundle;
    a power supply connected to the positive pole and the negative pole and operable to generate a DC current and to apply the DC current to the positive pole to generate the magnetic field to cause the ion current flow across the one or more gaps inside the vacuum interrupter; and
    a processor configured to measure the ion current flow across the one or more gaps inside the vacuum interrupter and to compare the measured iron current flow to a threshold value to determine a life expectancy of the vacuum interrupter.

2. The flexible magnetic coil system of claim 1, wherein the plurality of wires comprises from two insulated copper wires to one thousand insulated copper wires.

3. The flexible magnetic coil system of claim 2, wherein insulation around each individual insulated copper wire is a rubberized plastic or other insulating material.

4. The flexible magnetic coil system of claim 1, wherein an outer diameter of the bundle ranges from 0.1 inches to 2 inches.

5. The flexible magnetic coil system of claim 1, wherein the bundle creates a flexible electromagnetic field of at least 1 Gauss around the vacuum interrupter using a calculation of a number of turns of the plurality of wires multiplied by the applied DC current.

6. The flexible magnetic coil system of claim 1, wherein the power supply is configured to apply a DC voltage to the positive pole, wherein the DC voltage ranges from ten volts to four thousand volts.

7. The flexible magnetic coil system of claim 1, wherein the power supply is configured to apply a DC voltage to the positive pole, wherein the DC voltage ranges from 10 volts to one thousand volts.

8. A flexible magnetic coil for determining an ion migration quantity in a vacuum interrupter, the flexible magnetic coil comprising:
    a plurality of wires held together as a bundle and forming at least one loop around the vacuum interrupter;
    a first coupling secured on one end of the bundle and engaging each of the plurality of wires;
    a second coupling secured on an end of the bundle opposite the first coupling and engaging each of the plurality of wires, wherein the first coupling and the second coupling are adapted to engage each other, forming a flexible magnetic loop;
    a positive pole connected to the second coupling and operable to receive a positive DC current;
    a negative pole connected to the second coupling and operable to complete an electrical circuit with the positive pole to generate a magnetic field in the flexible magnetic loop when the positive DC current is applied to the positive pole to thereby cause an ion current to flow across at least one gap inside the vacuum interrupter;
    wherein the ion current is indicative of a life expectancy of the vacuum interrupter.

9. The flexible magnetic coil of claim 8, wherein the plurality of wires comprises from two insulated copper wires to one thousand insulated copper wires.

10. The flexible magnetic coil of claim 9, wherein insulation of the plurality of insulated copper wires is a rubberized plastic or other insulating material.

11. The flexible magnetic coil of claim 8, wherein an outer diameter of the bundle ranges from 0.1 inches to 2 inches.

12. The flexible magnetic coil of claim 8, wherein the flexible magnetic loop creates an electromagnetic field of at least one Gauss around the vacuum interrupter using a calculation of a number of turns of the plurality of wires multiplied by the applied DC current.

13. A flexible magnetic coil system for applying a magnetic field to cause ion current flow across one or more gaps inside a vacuum interrupter, the flexible magnetic coil system comprising:
   one or more wires held together as a flexible bundle, wherein the flexible bundle forms at least one loop around the vacuum interrupter and is re-loopable to form additional loops;
   a positive pole connected to the bundle for receiving a positive voltage and a negative pole connected to the bundle for receiving a negative voltage;
   a power supply connected to the positive pole and the negative pole and configured to apply the positive voltage to the positive pole and to apply the negative voltage to the negative pole to create the magnetic field at the at least one loop, wherein a strength of the magnetic field is adjustable by re-looping the bundle without adjusting the length of the bundle; and
   a processor configured to measure the ion current flow across the one or more gaps inside the vacuum interrupter and to determine a life expectancy of the vacuum interrupter based on the measured ion current flow.

14. The flexible magnetic coil system of claim 13, wherein the flexible bundle forms two or more loops by re-looping the flexible bundle.

15. The flexible magnetic coil system of claim 13, wherein the flexible bundle comprises a first coupling on a first end of the bundle and a second coupling on a second end of the bundle, wherein the first coupling couples to the second coupling to form the at least one loop.

16. The flexible magnetic coil system of claim 15, wherein the first coupling comprises the positive pole and the negative pole.

17. The flexible magnetic coil system of claim 15, wherein the flexible bundle has a length of between about two and about twenty feet.

* * * * *